«12» United States Patent
Huang

«10» Patent No.: US 6,353,257 B1
«45» Date of Patent: Mar. 5, 2002

«54» SEMICONDUCTOR PACKAGE CONFIGURATION BASED ON LEAD FRAME HAVING RECESSED AND SHOULDERED PORTIONS FOR FLASH PREVENTION

«75» Inventor: Chien-Ping Huang, Hsinchu Hsien (TW)

«73» Assignee: Siliconware Precision Industries Co., Ltd., Taichung (TW)

«*» Notice: Subject to any disclaimer, the term of this patent is extended or adjusted under 35 U.S.C. 154(b) by 0 days.

«21» Appl. No.: 09/574,598

«22» Filed: May 19, 2000

«51» Int. Cl.⁷ .............................................. H01L 23/12
«52» U.S. Cl. ....................................... 257/704; 257/666
«58» Field of Search .................................. 257/666, 704, 257/676, 687, 678, 667; 438/106

«56» References Cited

U.S. PATENT DOCUMENTS

| | | | |
|---|---|---|---|
| 5,070,041 A | | 12/1991 | Katayama et al. ........... 438/123 |
| 5,956,574 A | * | 9/1999 | Ichikawa et al. ............ 438/106 |
| 6,011,303 A | * | 1/2000 | Tanaka et al. ............... 257/704 |
| 6,281,568 B1 | * | 8/2001 | Glenn et al. ................. 257/666 |
| 6,291,263 B1 | * | 9/2001 | Huang ......................... 438/106 |

FOREIGN PATENT DOCUMENTS

JP        4-199661    *  7/1992

* cited by examiner

Primary Examiner—Phat Xuan Cao
«74» Attorney, Agent, or Firm—Peter F. Corless; Edwards & Angell, LLP

«57» ABSTRACT

A semiconductor package configuration is proposed for use to pack an semiconductor chip of an optically-sensitive type, such as an image-sensor chip or an ultraviolet-sensitive EP-ROM chip. This type of semiconductor chips are encapsulated in an encapsulation body having a centrally-hollowed portion whose opening is covered with a lid. This semiconductor package configuration is characterized in the use of a lead frame having a die-pad portion formed with a shouldered portion at the edge thereof and having a lead portion formed with a recessed portion at the point where the inner wall of the centrally-hollowed portion of the encapsulation body is located. The shoulder portion and the recessed portion are used to help prevent the flash of resin on lead frame during the molding process to form the encapsulation body in the manufacture of the semiconductor package configuration. As a result, it can help assure the quality of the bonding of the semiconductor chip on the die-bonding area of the die pad as well as the bonding of gold wires to the wire-bonding area on the leads of the lead frame.

11 Claims, 2 Drawing Sheets

SEMICONDUCTOR PACKAGE CONFIGURATION BASED ON LEAD FRAME HAVING RECESSED AND SHOULDERED PORTIONS FOR FLASH PREVENTION

BACKGROUND OF THE INVENTION

1. Field of the Invention

This invention relates to semiconductor packaging technology, and more particularly, to a semiconductor package module used to pack a semiconductor chip of an optically-sensitive type, such as an image-sensor chip or an ultraviolet-sensitive EP-ROM chip.

2. Description of Related Art

Semiconductor packaging technology is used to pack one or more semiconductor chips in a single module. Typically, the semiconductor chip or chips are enclosed inside an opaque encapsulating body, and thus is invisible from the outside. However, for optically-sensitive types of semiconductor chips, such as image-sensor chips or ultraviolet-sensitive EP-ROM (Electrically-Programmable Read-Only Memory) chips, it is required to allow these chips to be optically sensitive to outside light. For this reason, a special semiconductor package configuration is used to pack these types of semiconductor chips. One conventional package configuration to pack an optically-sensitive semiconductor chip is to mount it inside a centrally-hollowed encapsulation body and then, after performing wire bonding to the chip, hermetically seal an transparent lid over the opening of the centrally-hollowed portion of the encapsulation body.

One drawback to the forgoing package configuration, however, is that, during the manufacture thereof, resin flash on lead frame is a serious problem, which would undesirably degrade the quality of the die bonding and wire bonding on the flashed parts of the lead frame. To solve this problem, various solutions have been proposed, including, for example, the U.S. Pat. No. 5,070,041 entitled "METHOD OF REMOVING FLASH FROM A SEMICONDUCTOR LEADFRAME USING COATED LEADFRAME AND SOLVENT", which can remove resin flash built up on lead frame without damaging resin molded section. This patented method is characterized in the steps of coating an organic high-molecule substance over the areas of the lead frame that are to be unencapsulated by the encapsulation body, and then, after the encapsulation body is completely formed, using a solvent to remove the organic high-molecule coating, whereby the resin flash over the organic high-molecule coating can be together removed. After this, a semiconductor chip is mounted onto the flash-free die pad, and a lid is then covered to the opening of the centrally-hollowed portion of the encapsulation body.

The forgoing patented method, however, has the following two drawbacks. Firstly, the step of coating organic high-molecule substance and the subsequent step of dissolving the coating to remove resin flash are quite complex in procedure and costly to implement, making the overall manufacture process quite cost-ineffective. Secondly, the solvent being used would cause pollution and is thus environmentally-unfriendly to use.

SUMMARY OF THE INVENTION

It is therefore an objective of this invention to provide a new semiconductor package configuration for optically-sensitive semiconductor chips, which can help prevent resin flash on lead frame during the manufacture thereof.

It is another objective of this invention to provide a new semiconductor package configuration for optically-sensitive semiconductor chips, which is more simplified in procedure and more cost-effective to implement than the prior art.

It is still another objective of this invention to provide a new semiconductor package configuration for optically-sensitive semiconductor chips, which can be manufactured without having to use environmentally-unfriendly solvent that would cause pollution to the environment.

In accordance with the foregoing and other objectives, the invention proposes a new semiconductor package configuration for optically-sensitive semiconductor chips.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, four preferred embodiments are disclosed in full details in the following with reference to FIG. 1–4, FIG. 5, FIG. 6, and FIG. 7, respectively.

First Preferred Embodiment (FIGS. 1–4)

The first preferred embodiment of the semiconductor package configuration of the invention is disclosed in full details in the following with reference to FIGS. 1–4.

Figure 1:
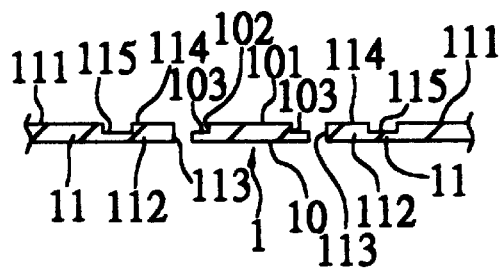
FIGS. 1–4 are schematic sectional diagrams used to depict the procedural steps involved in the manufacture of a first preferred embodiment of the semiconductor package configuration of the invention.

Referring to FIG. 1, in the manufacture of the semiconductor package configuration of the invention, the first step is to prepare a lead frame 1 having a die-pad portion 10 and a lead portion 11 (the lead portion 11 includes a plurality of leads when viewed from the top, which are not all shown in the sectional view of FIG. 1). The die pad 10 has a centrally-located die-bonding surface 101 and a peripherally-located shoulder portion 103 formed at the peripheral edge 102 thereof. The lead portion 11 of the lead frame 1 includes an outer-lead part 111 and an inner-lead part 112. The inner-lead part 112 is provided with a wire-bonding area 114. Moreover, the inner-lead part 112 is formed with a recessed portion 115 at a predefined location at the boundary between the encapsulated part and the unencapsulated part of the entire package body. The shoulder portion 103 and the recessed portion 115 can be formed through, for example, stamping or etching, preferably to a depth of from 0.04 mm to 0.15 mm (millimeter) and a width of from 0.5 mm to 2.0 mm.

Figure 2:
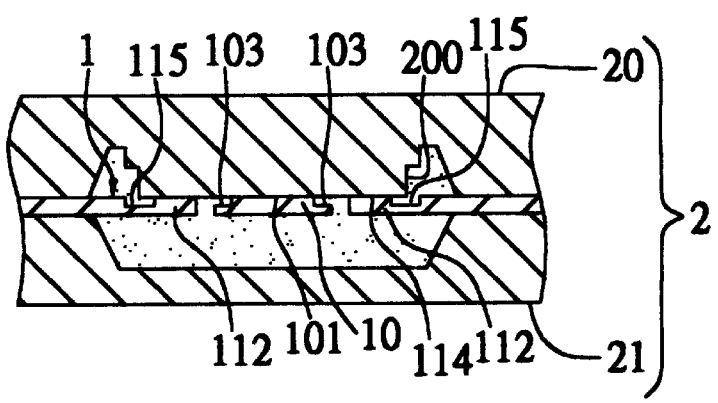

Referring further to FIG. 2, in the next step, with the lead frame 1 being fixed on a molding tool 2, a molding process is performed to form an encapsulation body 3. The molding tool 2 includes a top mold 20 and a bottom mold 21. The top mold 20 is formed with a cavity 200, while the bottom mold 21 is centrally recessed. When the lead frame 1 is clamped firmly between the top mold 20 and the bottom mold 21, the top mold 20 is abutted airtightly on the die-bonding surface 101 of the die pad 10 and the wire-bonding area 114 on the inner-lead part 112 of the lead frame 1, and its cavity 200 is aligned to the recessed portion 115 of the lead portion 11 of the lead frame 1. During the molding process, a molding material, such as resin, is filled into the hollowed portions of the top mold 20 and the bottom mold 21.

It is a characteristic feature of the invention that, during this molding process, since the die-bonding surface 101 and the wire-bonding area 114 are covered by the top mold 20, the recessed portion 115 and the shoulder portion 103 would each serve as a constricted passage as compared to the cavity 200 of the top mold 20 and the centrally-recessed portion of the bottom mold 21 where resin is injected, thus allowing the resin flowing into the shoulder portion 103 and the recessed portion 115 to be quickly absorbed the heat from the top mold 20, making it increased in viscosity and thereby decreased in flow speed. This allows the resin to be hardly to flash into the gap between the top mold 20 and the die-bonding surface 101 and the gap between the top mold 20 and the wire-bonding area 114. As a result, the die-bonding surface 101 and the wire-bonding area 114 would be substantially free of resin flash.

Figure 3:
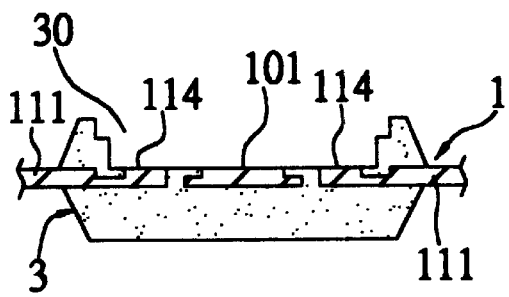

Referring further to FIG. 3, in the next step, the molding tool 2 is removed. Through the molding process, an encapsulation body 3 is formed. Due to the particular shape of the molding tool 2 being used in the molding process, the resulted encapsulation body 3 has a centrally-hollowed portion 30 in the upper part thereof, exposing the die-bonding surface 101 and the wire-bonding area 114. The outer-lead part 111 is exposed to the outside of the encapsulation body 3.

Figure 4:
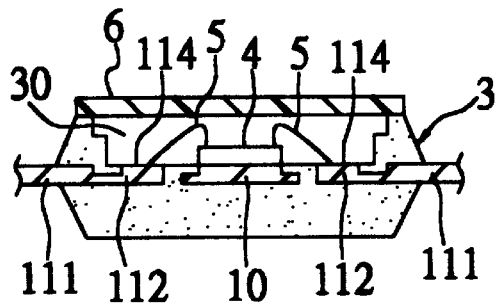

Referring further to FIG. 4, in the next step, a die-bonding process is performed to bond a semiconductor chip 4 over the die-bonding surface 101 by means of silver paste or adhesive tape. After this, a wire-bonding process is performed to bond a set of gold wires 5 for electrically coupling the semiconductor chip 4 to the wire-bonding area 114 on the inner-lead part 112 of the lead frame 1. Finally, a lidding process is performed to use a lid 6 to hermetically cover the top opening of the centrally-hollowed portion 30 of the encapsulation body 3. The lid 6 can be a transparent lid, such as a crystal glass lid or a plastic lid, or a nontransparent lid, such as a colored glass lid, a ceramic lid, or a colored plastic lid. This completes the manufacture of the semiconductor package configuration in accordance with the first preferred embodiment of the invention.

Figure 5:
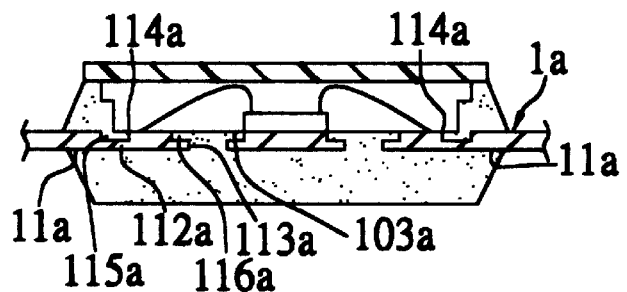
FIG. 5 is a schematic sectional diagram used to depict the a second preferred embodiment of the semiconductor package configuration of the invention.

Second Preferred Embodiment (FIG. 5)

The second preferred embodiment of the semiconductor package configuration of the invention is described in the following with reference to FIG. 5. In FIG. 5, the parts that are identical in structure and utilization as those in the previous embodiment are labeled with the same reference numerals appended with "a".

This embodiment differs from the previous one particularly in that the lead frame 1a is here additionally formed with a shouldered portion 113a at the inner end 113a of the lead portion 11a. During molding process, the shouldered portion 113a serves the same purpose as the shoulder portion 103a and the recessed portion 115a to retard resin flow speed, thus preventing resin flash to the wire-bonding area 114a.

Figure 6:
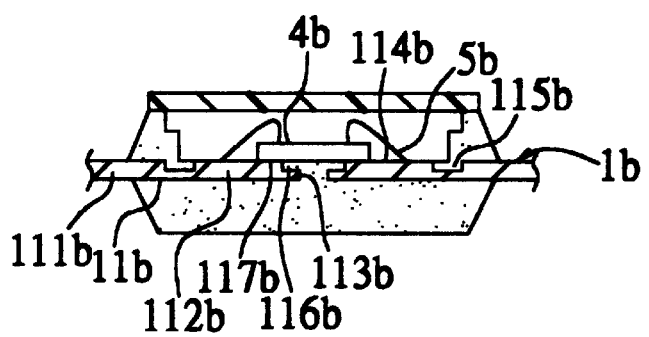
FIG. 6 is a schematic sectional diagram used to depict the a third preferred embodiment of the semiconductor package configuration of the invention.

Third Preferred Embodiment (FIG. 6)

The third preferred embodiment of the semiconductor package configuration of the invention is described in the following with reference to FIG. 6. In FIG. 6, the parts that are identical in structure and utilization as those in the previous embodiments are labeled with the same reference numerals appended with "b".

This embodiment differs from the previous ones particularly in that the lead frame 1b being used in this embodiment is the type having no die pad and including only a lead portion 11b (the lead portion 11b includes a plurality of leads when viewed from the top) having an outer-lead part 111b and an inner-lead part 112b. The inner-lead part 111b is formed with a die-bonding area 117b and a wire-bonding area 114b. Further, a recessed portion 115b is formed at the point where the side wall of the centrally-hollowed portion of the encapsulating body is located. The end of the inner-lead part 112b is shaped into a shouldered portion 116b. The recessed portion 115b and the shouldered portion 116b can help prevent resin flash during the molding step of the manufacture process. As a result, it can help assure quality of the mounting of the semiconductor chip 4b on the die-bonding area 117b as well as the bonding of the gold wires 5b to the wire-bonding area 114b.

Figure 7:
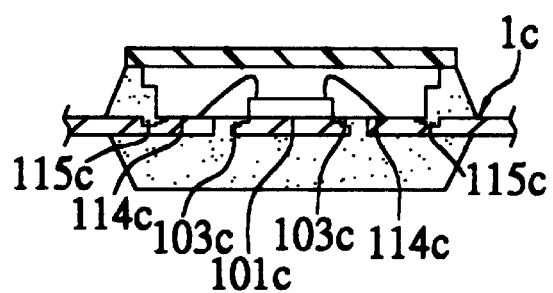
FIG. 7 is a schematic sectional diagram used to depict the a fourth preferred embodiment of the semiconductor package configuration of the invention.

Fourth Preferred Embodiment (FIG. 7)

The fourth preferred embodiment of the semiconductor package configuration of the invention is described in the following with reference to FIG. 7. In FIG. 7, the parts that are identical in structure and utilization as those in the previous embodiments are labeled with the same reference numerals appended with "c".

This embodiment differs from the first and second embodiments particularly in that the shoulder portion 103c and the recessed portion 115c in the lead frame 1c are both formed into a multi-step staircase-like shape. During the molding process, this multi-step staircase-like shape would help increase the contact surface between the melted flowing resin and the lead frame 1c, thus allowing the resin to be more quickly absorbed the heat rom the top mold than the previous embodiments, making the resin more quickly increased in viscosity and thereby reduced in flow speed. The resin would less likely flash to the die-mounting surface 101c and the wire-bonding area 114c.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package configuration, which comprises:

a lead frame having a die-pad portion and a lead portion;

a semiconductor chip mounted on the die-pad portion of the lead frame;

a set of bonding wires for electrically coupling the semiconductor chip to the lead frame;

an encapsulation body having a centrally-hollowed portion, for encapsulating the semiconductor chip; and a lid for covering the opening of the centrally-hollowed portion of the encapsulation body; wherein the die-pad portion of the lead frame is formed with a shouldered portion at the edge thereof, while the lead portion of the lead frame is formed with a recessed portion at the point where the inner wall of the centrally-hollowed portion of the encapsulation body is located; the shoulder portion and the recessed portion being used to help prevent flash of a molding material being used in the forming of the encapsulation process during manufacture of the semiconductor package configuration.

2. The semiconductor package configuration of claim 1, wherein the shoulder portion and the recessed portion are each formed to a depth of from 0.04 mm to 0.15 mm and a width of from 0.5 mm to 2.0 mm.

3. The semiconductor package configuration of claim 1, wherein the shoulder portion and the recessed portion are both formed through stamping.

4. The semiconductor package configuration of claim 1, wherein the shoulder portion and the recessed portion are both formed through etching.

5. The semiconductor package configuration of claim 1, wherein the die-pad portion of the lead frame is defined with a die-bonding area where the semiconductor chip is mounted, while the lead portion having a wire-bonding area where the bonding wires are bonded.

6. The semiconductor package configuration of claim 1, wherein the lead frame is a type having no die pad and includes a plurality of leads whose inner ends are collectively defined as a die-bonding area and having middle sections defined as a wire-bonding area.

7. The semiconductor package configuration of claim 1, wherein the shoulder portion and the recessed portion are each formed into a flat bottom surface.

8. The semiconductor package configuration of claim 1, wherein the shoulder portion and the recessed portion are each formed into a multi-step staircase-like shape.

9. The semiconductor package configuration of claim 1, wherein the lid is a transparent lid.

10. The semiconductor package configuration of claim 1, wherein the lid is a nontransparent lid.

11. The semiconductor package configuration of claim 1, wherein the bonding wires are gold wires.

* * * * *